US012794451B2

(12) United States Patent
Yang et al.

(10) Patent No.: US 12,794,451 B2
(45) Date of Patent: Nov. 10, 2026

(54) HALF-BRIDGE DRIVING CIRCUIT AND DRIVING METHOD THEREOF FOR ELIMINATING REVERSE RECOVERY CHARGE OF LOW-SIDE TRANSISTOR

(71) Applicant: Richtek Technology Corporation, Zhubei City (TW)

(72) Inventors: Ta-Yung Yang, Taoyuan City (TW); Kwan-Jen Chu, Zhubei City (TW); Kuo-Chi Liu, Hsinchu City (TW)

(73) Assignee: RICHTEK TECHNOLOGY CORPORATION, Zhubei City (TW)

( * ) Notice: Subject to any disclaimer, the term of this patent is extended or adjusted under 35 U.S.C. 154(b) by 0 days.

(21) Appl. No.: 19/270,817

(22) Filed: Jul. 16, 2025

(65) Prior Publication Data

US 2026/0074681 A1 Mar. 12, 2026

Related U.S. Application Data

(60) Provisional application No. 63/692,743, filed on Sep. 10, 2024.

(30) Foreign Application Priority Data

Jun. 10, 2025 (TW) ................................ 114121557

(51) Int. Cl.
*H03K 3/01* (2006.01)
*H03K 3/012* (2006.01)
*H03K 17/56* (2006.01)

(52) U.S. Cl.
CPC ............. *H03K 3/012* (2013.01); *H03K 17/56* (2013.01); *H03K 2217/0063* (2013.01); *H03K 2217/0072* (2013.01)

(58) Field of Classification Search
CPC .................. H03K 3/012; H03K 17/56; H03K 2217/0063; H03K 2217/0072;
(Continued)

(56) References Cited

U.S. PATENT DOCUMENTS

2018/0026538 A1* 1/2018 Dalena ................ H02M 3/1584 323/271
2018/0287493 A1* 10/2018 Riva .................. H02M 3/1588
(Continued)

FOREIGN PATENT DOCUMENTS

CN 114665857 A 6/2022
JP 2018182818 A 11/2018
(Continued)

*Primary Examiner* — Adam D Houston
(74) *Attorney, Agent, or Firm* — McClure, Qualey & Rodack, LLP

(57) ABSTRACT

A driving circuit includes a high-side transistor, a first low-side transistor, a second low-side transistor, and a control circuit. The high-side transistor is coupled between an input voltage and a switch node. The first low-side transistor is coupled between the switch node and a ground. The second low-side transistor is coupled between the switch node and the ground. The control circuit periodically and individually turns on the high-side transistor and the first low-side transistor. After the first low-side transistor is turned off, the control circuit keeps the second low-side transistor on until the high-side transistor is turned on, so as to eliminate the reverse recovery charge of the first low-side transistor.

20 Claims, 6 Drawing Sheets

100

(58) Field of Classification Search
CPC .. H03K 2217/0036; H03K 2217/0081; H02M 1/088
See application file for complete search history.

(56) References Cited

U.S. PATENT DOCUMENTS

| | | | | |
|---|---|---|---|---|
| 2023/0188130 | A1 | 6/2023 | Bondade | |
| 2023/0188133 | A1* | 6/2023 | Sethumadhavan | H03K 17/165 318/400.22 |
| 2025/0364898 | A1* | 11/2025 | Yang | H02M 1/088 |
| 2026/0074681 | A1* | 3/2026 | Yang | H03K 3/012 |
| 2026/0135461 | A1* | 5/2026 | Chu | H02M 1/0051 |

FOREIGN PATENT DOCUMENTS

| | | | |
|---|---|---|---|
| TW | I764792 | B | 5/2022 |
| TW | I783615 | B | 11/2022 |

* cited by examiner

100

HALF-BRIDGE DRIVING CIRCUIT AND DRIVING METHOD THEREOF FOR ELIMINATING REVERSE RECOVERY CHARGE OF LOW-SIDE TRANSISTOR

CROSS REFERENCE TO RELATED APPLICATIONS

This application claims the benefit of U.S. Provisional Application No. 63/692,743, filed on Sep. 10, 2024, the entirety of which is incorporated by reference herein.

This Application claims priority of Taiwan Patent Application No. 114121557, filed on Jun. 10, 2025, the entirety of which is incorporated by reference herein.

BACKGROUND OF THE INVENTION

Field of the Invention

The disclosure is generally related to a driving circuit and a driving method thereof, and more particularly it is related to a half-bridge driving circuit and a driving method thereof for eliminating the reverse recovery charge of a low-side transistor.

Description of the Related Art

FIG. 1 is a schematic diagram of a power conversion circuit. It shows that the power conversion circuit 100 is a synchronous buck converter. When the high-side transistor QH is turned on, the charging current IC generated by the input voltage VIN flows through the high-side transistor QH, the inductor L, and the load LD to the ground, where the output capacitor CO is configured to maintain the output voltage VO. When the high-side transistor QH is turned off and the low-side transistor QL is turned on, the discharge current ID flows from the ground through the low-side transistor QL, the inductor L, and the load LD. When the low-side transistor QL is turned off, the discharge current ID flows through the parasitic diode DP of the low-side transistor QL instead, so that many minority carriers are accumulated at the drain terminal and the base terminal of the low-side transistor QL, forming a stored charge. When the high-side transistor QH is turned on again, the minority carriers accumulated at the drain terminal and the base terminal of the low-side transistor QL must be removed, and the removal of the accumulated minority carriers is called the reverse recovery charge.

In a switching power conversion circuit, the reverse recovery charge of the switch element has always been the efficiency killer of the power conversion circuit. In addition, the reverse recovery charge cannot be reduced through solely circuit means, so it has always been ignored. However, with the rise of the operating frequency of power conversion circuits, the impact of the reverse recovery charge on efficiency has become increasingly serious, and it has become a problem that must be addressed.

BRIEF SUMMARY OF THE INVENTION

The present invention proposes a driving circuit and a driving method capable of eliminating the reverse recovery charge of the low-side transistor. By dividing the low-side transistor into a first low-side transistor and a second low-side transistor and delaying the shutdown of the second low-side transistor having a smaller size, it is helpful to eliminate the reverse recovery charge accumulated at the drain terminal of the low-side transistor, thereby improving the power conversion efficiency.

In an embodiment, a driving circuit is provided. The driving circuit comprises a high-side transistor, a first low-side transistor, a second low-side transistor, and a control circuit. The high-side transistor is coupled between an input voltage and a switch node. The first low-side transistor is coupled between the switch node and a ground. The second low-side transistor is coupled between the switch node and the ground. The control circuit periodically and individually turns on the high-side transistor and the first low-side transistor. After the first low-side transistor is turned off, the control circuit keeps the second low-side transistor on until the high-side transistor is turned on, so as to eliminate the reverse recovery charge of the first low-side transistor.

According to an embodiment of the present invention, when the high-side transistor is turned on, the control circuit turns off the second low-side transistor based on a voltage of the switch node.

According to an embodiment of the present invention, after the first low-side transistor is turned off and a delay time has been elapsed, the control circuit turns off the second low-side transistor.

According to an embodiment of the present invention, the delay time is determined by a resistor and a parasitic capacitor of a gate terminal of the second low-side transistor.

According to an embodiment of the present invention, a size of the second low-side transistor is less than a size of the first low-side transistor.

According to an embodiment of the present invention, on-resistance of the second low-side transistor exceeds on-resistance of the first low-side transistor.

According to an embodiment of the present invention, the control circuit further comprises a discharge control circuit. The discharge control circuit comprises a clamp transistor and a control transistor. The clamp transistor provides a voltage of the switch node to a control node based on a clamp voltage to generate a control signal. The control transistor couples a gate terminal of the second low-side transistor to the ground based on the control signal.

According to an embodiment of the present invention, the clamp transistor is configured to limit the voltage level of the control signal to not exceed the clamp voltage minus the threshold voltage of the clamp transistor, preventing the control signal from getting too high and burning out the control transistor. When the high-side transistor is turned on, the clamp transistor enables the control signal based on the voltage of the switch node. The control signal being enabled turns on the control transistor, causing the control transistor to couple the gate terminal of the second low-side transistor to the ground, so as to turn off the second low-side transistor.

According to an embodiment of the present invention, the discharge control circuit further comprises a delay capacitor, a discharge resistor, and a delay resistor. The delay capacitor is coupled between the gate terminal of the second low-side transistor and the ground. The discharge resistor is coupled between the gate terminal of the second low-side transistor and the ground. The delay resistor is coupled between a gate terminal of the first low-side transistor and the gate terminal of the second low-side transistor.

According to an embodiment of the present invention, a delay time from the first low-side transistor being turned off to the second low-side transistor being turned off is determined by a product of the delay resistor and a sum of the delay capacitor and a parasitic capacitor of the gate terminal of the second low-side transistor. When the control transistor is turned off, the discharge resistor is configured to couple the gate terminal of the second low-side transistor to the ground and to discharge the delay capacitor.

According to an embodiment of the present invention, the high-side transistor, the first low-side transistor, and the second low-side transistor form a half-bridge driving circuit.

In another embodiment, a driving method for driving a half-bridge driving circuit is provided. The driving method comprises the following steps. A first low-side transistor and a second low-side transistor of the half-bridge driving circuit are turned on and a high-side transistor of the half-bridge driving circuit is turned off in a first driving period. The first low-side transistor and the high-side transistor are turned off and the second low-side transistor is kept on during a dead time after the first driving period, so as to eliminate reverse recovery charge of the first low-side transistor. The second low-side transistor is turned off and the high-side transistor is turned on in a second driving period after the dead time.

According to an embodiment of the present invention, the high-side transistor is coupled between an input voltage and a switch node, and the first low-side transistor and the second low-side transistor are coupled between the switch node and a ground. The step of turning off the second low-side transistor and turning on the high-side transistor further comprises the following steps. The second low-side transistor is turned off in response to a voltage of the switch node rising to a threshold voltage.

According to an embodiment of the present invention, the step of turning off the second low-side transistor and turning on the high-side transistor further comprises the following steps. The voltage of the switch node is received by the drain terminal of a clamp transistor to generate a control signal. A clamp voltage is received by a gate terminal of the clamp transistor to limit the voltage level of the control signal. The second low-side transistor is turned off based on the control signal. When the control signal is enabled, the second low-side transistor is turned off.

According to an embodiment of the present invention, the step of turning off the second low-side transistor and turning on the high-side transistor further comprises the following steps. The control signal is provided to a gate terminal of a control transistor. When the control signal is enabled, a gate terminal of the second low-side transistor is coupled to the ground by the control transistor to turn off the second low-side transistor. When the control signal is disabled, the control transistor is turned off.

According to an embodiment of the present invention, after the high-side transistor is turned on, the second low-side transistor is turned off.

According to an embodiment of the present invention, there is a delay time between the first low-side transistor being turned off and the second low-side transistor being turned off. The delay time is determined by a delay resistor and a parasitic capacitor of a gate terminal of the second low-side transistor.

According to an embodiment of the present invention, a delay capacitor is coupled between the gate terminal of the second low-side transistor and a ground. The delay time is determined by a product of the delay resistor and a sum of the delay capacitor and the parasitic capacitor of the gate terminal of the second low-side transistor.

According to an embodiment of the present invention, the first low-side transistor and the second low-side transistor form a transistor array. The second low-side transistor is related to the first low-side transistor.

According to an embodiment of the present invention, on-resistance of the first low-side transistor is less than on-resistance of the second low-side transistor.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
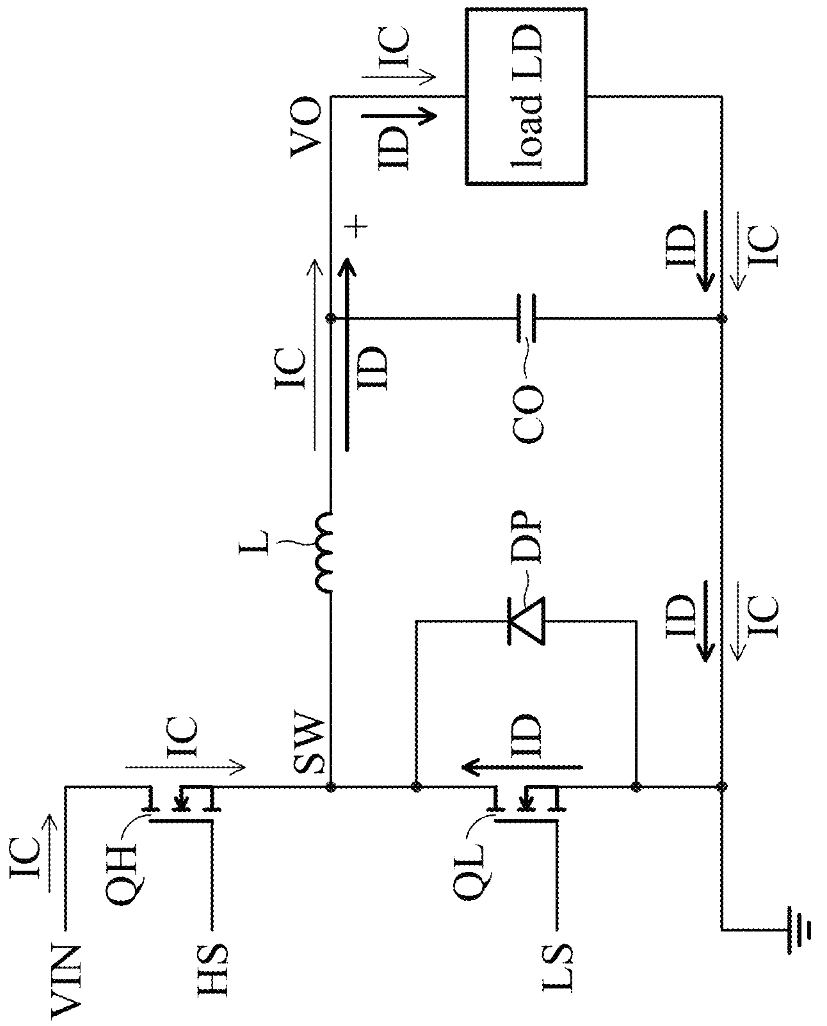
FIG. 1 is a schematic diagram of a power conversion circuit.

The following description is made for the purpose of illustrating the general principles of the disclosure and should not be taken in a limiting sense. The scope of the disclosure is determined by reference to the appended claims.

In the following detailed description, for purposes of explanation, numerous specific details and embodiments are set forth in order to provide a thorough understanding of the present disclosure. The use of like and/or corresponding numerals in the drawings of different embodiments does not suggest any correlation between different embodiments.

In addition, in some embodiments of the present disclosure, terms concerning attachments, coupling and the like, such as "connected" and "interconnected," refer to a relationship wherein structures are secured or attached to one another either directly or indirectly (for example, electrically connection) via intervening structures, as well as both movable or rigid attachments or relationships, unless expressly described otherwise.

In addition, in this specification, relative spatial expressions are used. For example, "lower", "bottom", "higher" or "top" are used to describe the position of one element relative to another. It should be appreciated that if a device is flipped upside down, an element that is "lower" will become an element that is "higher".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section in the specification could be termed a second element, component, region, layer, portion or section in the claims without departing from the teachings of the present disclosure.

It should be understood that this description of the exemplary embodiments is intended to be read in connection with the accompanying drawings, which are to be considered part of the entire written description. The drawings are not drawn to scale. In addition, structures and devices are shown schematically in order to simplify the drawing.

The terms "approximately", "about" and "substantially" typically mean a value is within a range of +/−20% of the stated value, more typically a range of +/−10%, +/−5%, +/−3%, +/−2%, +/−1% or +/−0.5% of the stated value. The stated value of the present disclosure is an approximate value. Even there is no specific description, the stated value still includes the meaning of "approximately", "about" or "substantially".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In addition, in some embodiments of the present disclosure, terms concerning attachments, coupling and the like, such as "connected" and "interconnected," refer to a relationship wherein structures are secured or attached to one another either directly or indirectly (for example, electrically connection) via intervening structures, as well as both movable or rigid attachments or relationships, unless expressly described otherwise.

In the drawings, similar elements and/or features may have the same reference number. Various components of the same type can be distinguished by adding letters or numbers after the component symbol to distinguish similar components and/or similar features.

Figure 2:
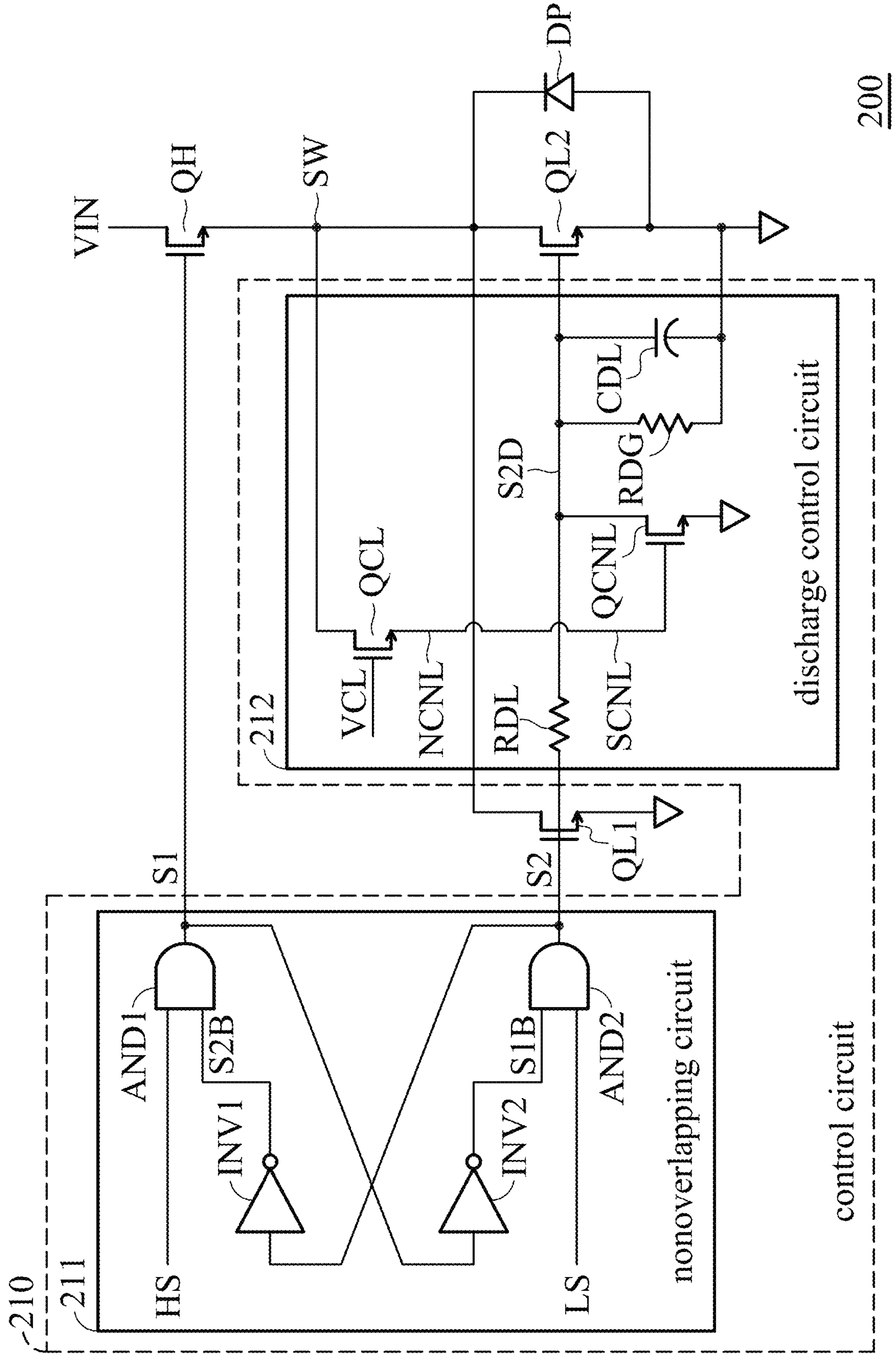
FIG. 2 is a circuit diagram of a driving circuit in accordance with an embodiment of the present invention.

FIG. 2 is a circuit diagram of a driving circuit in accordance with an embodiment of the present invention. As shown in FIG. 2, the driving circuit 200 includes a high-side transistor QH, a first low-side transistor QL1, a second low-side transistor QL2, and a control circuit 210. Comparing the driving circuit 200 with the power conversion circuit 100 of FIG. 1, the low-side transistor QL of FIG. 1 is replaced by the first low-side transistor QL1 and the second low-side transistor QL2.

According to some embodiments of the present invention, the first low-side transistor QL1 and the second low-side transistor QL2 form a transistor array, and the second low-side transistor QL2 is related to the first low-side transistor QL1. In addition, the parasitic diode DP is a parasitic diode generated by the first low-side transistor QL1 and the second low-side transistor QL2. According to some embodiments of the present invention, the size of the first low-side transistor QL1 is larger than the size of the second low-side transistor QL2.

According to some embodiments of the present invention, the on-resistance of the first low-side transistor QL1 is less than the on-resistance of the second low-side transistor QL2. According to some embodiments of the present invention, the on-resistance of the second low-side transistor QL2 is more than five times the on-resistance of the first low-side transistor QL1. According to some embodiments of the present invention, the low-side transistor QL in FIG. 1 is divided into the first low-side transistor QL1 and the second low-side transistor QL2, and the size of the first low-side transistor QL1 is larger than the size of the second low-side transistor QL2. In other words, the low-side transistor QL in FIG. 1 is divided into the first low-side transistor QL1 and the second low-side transistor QL2, where the on-resistance of the second low-side transistor QL2 is more than five times the on-resistance of the first low-side transistor QL1.

According to some embodiments of the present invention, the size or the on-resistance of the second low-side transistor QL2 is related to the reverse recovery charge, which will be further described in the following paragraphs. The control circuit 210 includes a nonoverlapping circuit 211 and a discharge control circuit 212. The nonoverlapping circuit 211 generates a first signal S1 and a second signal S2 based on the high-side driving signal HS and the low-side driving signal LS, and includes a first inverter INV1, a first AND gate AND1, a second inverter INV2, and a second AND gate AND2.

According to an embodiment of the present invention, when the first signal S1 and the second signal S2 are both in a disabled state and the high-side driving signal HS is in an enabled state, the first inverter INV1 inverts the disabled second signal S2 to generate an enabled second inverted signal S2B. The first AND gate AND1 performs a logical AND operation on the enabled high-side driving signal HS and the enabled second inverted signal S2B to generate an enabled first signal S1, so that the high-side transistor QH is turned on based on the enabled first signal S1. According to another embodiment of the present invention, when the high-side driving signal HS is in the disabled state and the low-side driving signal LS is in the disabled state (i.e., a low voltage level), the first signal S1 and the second signal S2 are both in the disabled state.

According to another embodiment of the present invention, when the high-side driving signal HS is in a disabled state and the low-side driving signal LS is in an enabled state, the second inverter INV2 inverts the disabled first signal S1 to generate an enabled first inverted signal S1B. The second AND gate AND2 performs a logical AND operation on the enabled first inverted signal S1B and the enabled low-side driving signal LS to generate an enabled second signal S2, so that the first low-side transistor QL1 is turned on based on the enabled second signal S2. In other words, the nonoverlapping circuit 211 is configured to ensure that the high-side transistor QH and the first low-side transistor QL1 are not turned on at the same time.

The discharge control circuit 212 includes a delay resistor RDL, a delay capacitor CDL, a clamp transistor QCL, a control transistor QCNL, and a discharge resistor RDG. The delay resistor RDL is coupled between the gate terminal of the first low-side transistor QL1 and the gate terminal of the second low-side transistor QL2, and the delay capacitor CDL is coupled between the gate terminal of the second low-side transistor QL2 and the ground terminal, where the delay resistor RDL and the delay capacitor CDL are configured to delay the second signal S2 to generate a second delay signal S2D.

According to some embodiments of the present invention, the delay time from the first low-side transistor QL1 turning off to the second low-side transistor QL2 turning off is determined by the product of the delay resistor RDL and the sum of the delay capacitor CDL and the parasitic capacitance of the gate terminal of the second low-side transistor QL2. According to other embodiments of the present invention, the delay capacitor CDL can be omitted and the delay time from the first low-side transistor QL1 being turned off to the second low-side transistor QL2 being turned off can be determined only by the product of the delay resistor RDL and the parasitic capacitance of the gate terminal of the second low-side transistor QL2.

The clamp transistor QCL provides the voltage of the switch node SW to the control node NCNL based on the clamp voltage VCL to generate the control signal SCNL. The control transistor QCNL couples the second delay signal S2D to the ground based on the control signal SCNL, thereby turning off the second low-side transistor QL2.

The discharge resistor RDG is coupled between the gate terminal of the second low-side transistor QL2 and the ground, and is configured to continuously couple the gate terminal of the second low-side transistor QL2 to the ground when the control transistor QCNL is turned off. According to an embodiment of the present invention, when the control transistor QCNL is turned off, the discharge resistor RDG is configured to discharge the delay capacitor CDL to turn off the second low-side transistor QL2.

According to some embodiments of the present invention, when the high-side transistor QH is turned on, the high-side transistor QH provides the input voltage VIN to the switch node SW, so that the voltage of the switch node SW rises. The clamp transistor QCL generates the control signal SCNL based on the clamp voltage VCL and the voltage of the switch node SW. When the voltage of the switch node SW exceeds the threshold voltage of the control transistor QCNL, the control transistor QCNL is turned on and the second delay signal S2D is coupled to the ground, thereby turning off the second low-side transistor QL2.

In addition, since the input voltage VIN directly driving the control transistor QCNL may cause the control transistor QCNL to burn out, the clamp voltage VCL is configured to limit the voltage level of the control signal SCNL to less than the clamp voltage VCL minus the threshold voltage of the clamp transistor QCL, so as to protect the control transistor QCNL from burning out. According to some embodiments of the present invention, the high-side transistor QH, the first low-side transistor QL1, and the second low-side transistor QL2 in FIG. 2 form a half-bridge drive circuit, and the discharge control circuit 212 is configured to control the timing of turning on and off the second low-side transistor QL2.

Figure 3:
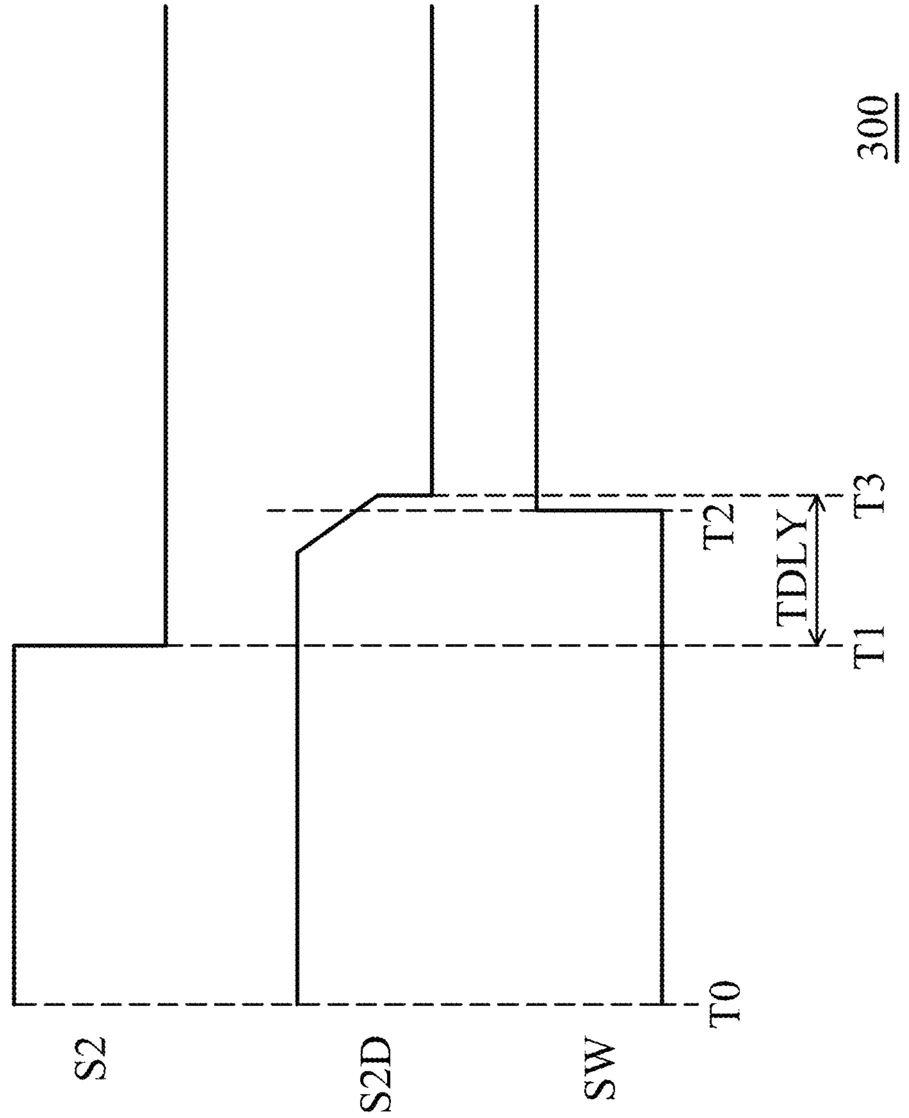
FIG. 3 is a waveform diagram of a driving circuit in accordance with an embodiment of the present invention.

FIG. 3 is a waveform diagram of a driving circuit in accordance with an embodiment of the present invention. The following description of the waveform diagram 300 in FIG. 3 will be combined with the drive circuit 200 in FIG. 2 for detailed description.

As shown in FIG. 3, between the initial time point T0 and the first time point T1, the second signal S2 and the second delay signal S2D are both enabled, so that the first low-side transistor QL1 and the second low-side transistor QL2 are both turned on. When the second signal S2 changes from a high logic level to a low logic level at the first time point T1, the first low-side transistor QL1 is turned off, and the second low-side transistor QL2 remains turned on.

In other words, at the first time point T1, the first low-side transistor QL1 is turned off. The delay resistor RDL, the delay capacitor CDL, and the parasitic capacitance of the gate terminal of the second low-side transistor QL2 generate a delay time to keep the second low-side transistor QL2 on between the first time point T1 and the second time point T2, so as to eliminate the accumulated reverse recovery charge at the drain terminals of the first low-side transistor QL1 and the second low-side transistor QL2.

At the second time point T2, the high-side transistor QH is turned on and the voltage of the switch node SW rises. As shown in FIG. 2, when the high-side transistor QH is turned on, the high-side transistor QH provides the input voltage VIN to the switch node SW, so that the voltage of the switch node SW rises. The rising voltage of the switch node SW pulls the second delay signal S2D down to a low logic level through the clamp transistor QCL and the control transistor QCNL, thereby turning off the second low-side transistor QL2. According to an embodiment of the present invention, when the voltage of the switch node SW exceeds the threshold voltage of the control transistor QCNL, the control transistor QCNL is turned on to disable the second delay signal S2D, thereby turning off the second low-side transistor QL2.

As shown in FIG. 3, when the second delay signal S2D is pulled down to a low logic level at the third time point T3, the second low-side transistor QL2 is turned off. According to some embodiments of the present invention, the length from the second time point T2 to the third time point T3 is the delay time from the high-side transistor QH being turn on to the voltage of the switch node SW rising to turn off the second low-side transistor QL2.

According to some embodiments of the present invention, the delay time generated by the delay resistor RDL, the delay capacitor CDL, and the parasitic capacitance of the gate terminal of the second low-side transistor QL2 is not less than the length from the first time point T1 to the second time point T2. In the embodiment shown in FIG. 3, the delay time TDLY generated by the delay resistor RDL, the delay capacitor CDL, and the parasitic capacitance of the gate terminal of the second low-side transistor QL2 may be the length from the first time point T1 to the third time point T3.

According to other embodiments of the present invention, the delay time generated by the delay resistor RDL, the delay capacitor CDL, and the parasitic capacitance of the gate terminal of the second low-side transistor QL2 may exceed the length from the first time point T1 to the third time point T3. According to an embodiment of the present invention, the period between the first time point T1 and the second time point T2 is a dead time during which both the high-side transistor QH and the first low-side transistor QL1 are turned off. According to some embodiments of the present invention, the size or on-resistance of the second low-side transistor QL2 is adjusted so that the reverse recovery charge can be completely eliminated during the period between the first time point T1 and the second time point T2 (i.e., the dead time). In other words, the size or on-resistance of the second low-side transistor QL2 is related to the reverse recovery charge.

According to an embodiment of the present invention, when the reverse recovery charge increases, the size of the second low-side transistor QL2 is increased to reduce the on-resistance of the second low-side transistor QL2, so that the reverse recovery charge accumulated at the drain terminals of the first low-side transistor QL1 and the second low-side transistor QL2 can be completely eliminated during the period between the first time point T1 and the second time point T2.

According to another embodiment of the present invention, when the reverse recovery charge decreases, the size of the second low-side transistor QL2 is reduced to increase the on-resistance of the second low-side transistor QL2, so that not only the reverse recovery charge is completely eliminated during the period between the first time point T1 and the second time point T2, but also the power loss caused by the high-side transistor QH and the second low-side transistor QL2 being turned on simultaneously during the period between the second time point T2 and the third time point T3 can be reduced, thereby improving the power conversion efficiency.

Since the second low-side transistor QL2 continues to be turned on after the first low-side transistor QL1 is turned off, it helps to eliminate the reverse recovery charge accumulated at the drain terminals (i.e., the switch node SW of FIG.

2) of the first low-side transistor QL1 and the second low-side transistor QL2, thereby improving the power conversion efficiency.

Figure 4:
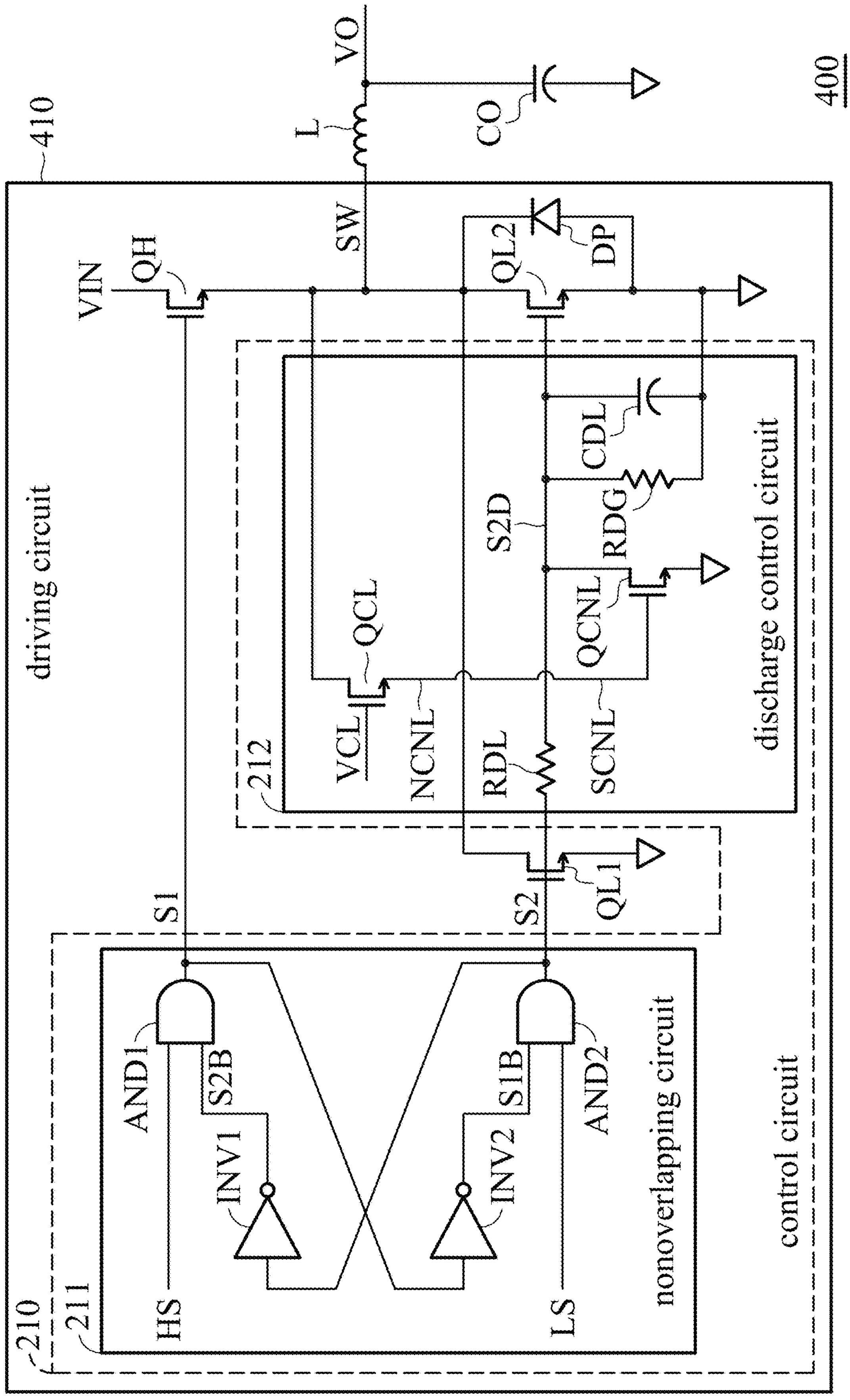
FIG. 4 is a circuit diagram of a power conversion circuit in accordance with an embodiment of the present invention.

FIG. 4 is a circuit diagram of a power conversion circuit in accordance with an embodiment of the present invention. As shown in FIG. 4, the power conversion circuit 400 includes a driving circuit 410, an inductor L, and an output capacitor CO. According to some embodiments of the present invention, the driving circuit 410 corresponds to the driving circuit 200 of FIG. 2. The inductor L is coupled between the switch node SW and the output voltage VO, and the output capacitor CO is coupled between the output voltage VO and the ground.

According to an embodiment of the present invention, the power conversion circuit 400 is a synchronous buck converter. In other words, the driving circuit 200 of FIG. 2 is configured to drive the synchronous buck conversion circuit, and effectively eliminates the reverse recovery charge of the low-side transistor, thereby improving the power conversion efficiency.

Figure 5:
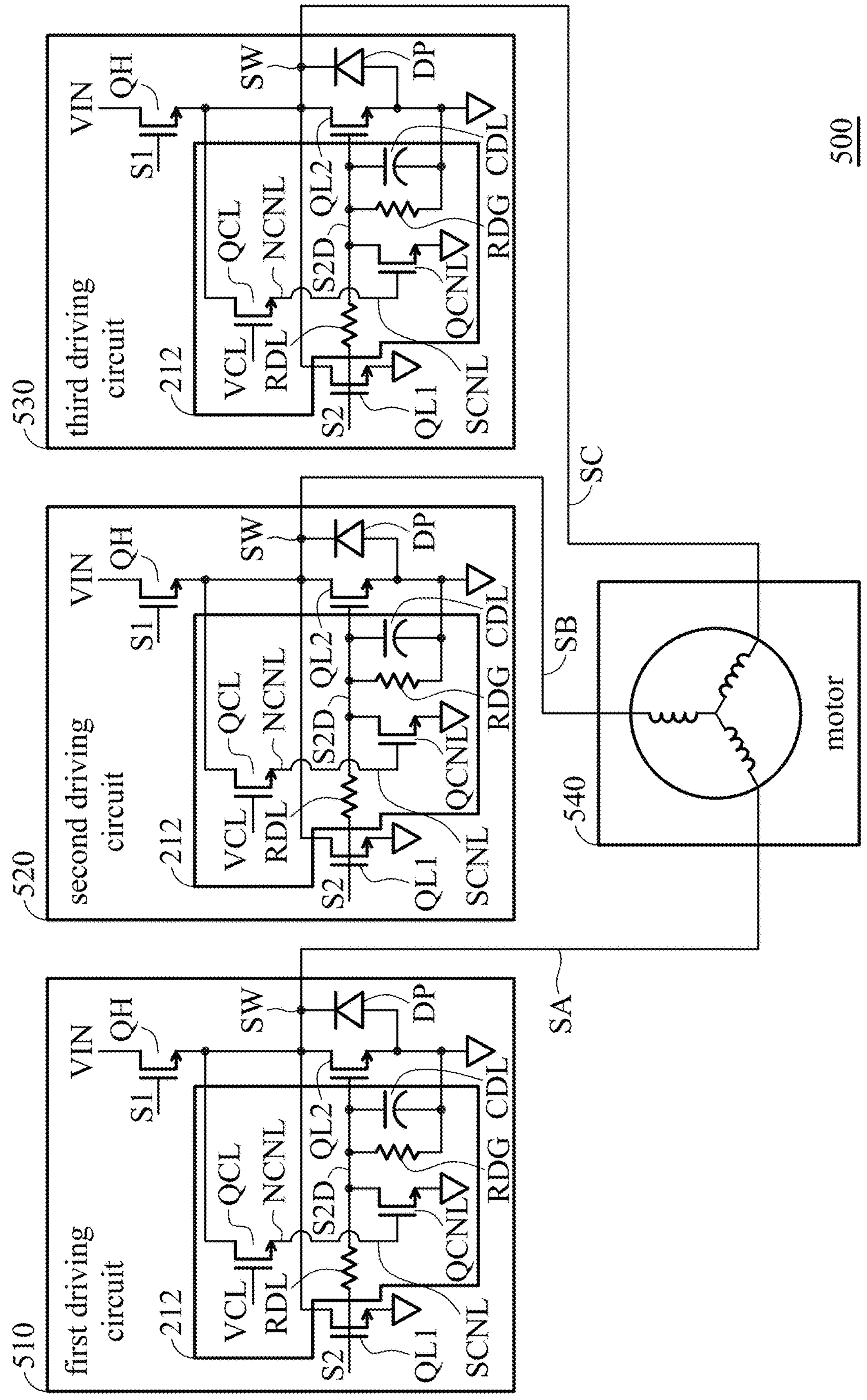
FIG. 5 is a circuit diagram of a motor driving circuit in accordance with another embodiment of the present invention.

FIG. 5 is a circuit diagram of a motor driving circuit in accordance with another embodiment of the present invention. As shown in FIG. 5, the motor driving circuit 500 includes a first driving circuit 510, a second driving circuit 520, a third driving circuit 530, and a motor 540. According to some embodiments of the present invention, the first driving circuit 510, the second driving circuit 520, and the third driving circuit 530 all correspond to the driving circuit 200 of FIG. 2.

In FIG. 5, it is only illustrated herein that any one of the first driving circuit 510, the second driving circuit 520, and the third driving circuit 530 only includes the high-side transistor QH, the first low-side transistor QL1, the second low-side transistor QL2, and the discharge control circuit 212 for explanation. Any of the first driving circuit 510, the second driving circuit 520, and the third driving circuit 530 may also include the nonoverlapping circuit 211.

As shown in FIG. 5, the switch nodes SW of the first driving circuit 510, the second driving circuit 520, and the third driving circuit 530 respectively generate the first driving signal SA, the second driving signal SB, and the third driving signal SC for driving the motor 540. According to some embodiments of the present invention, since the second low-side driving transistor QL2 of the first driving circuit 510, the second driving circuit 520 and the third driving circuit 530 is configured to eliminate the reverse recovery charge accumulated at the drain terminals of the first low-side transistor QL1 and the second low-side transistor QL2, the efficiency of the driving motor 540 can be greatly improved.

Figure 6:
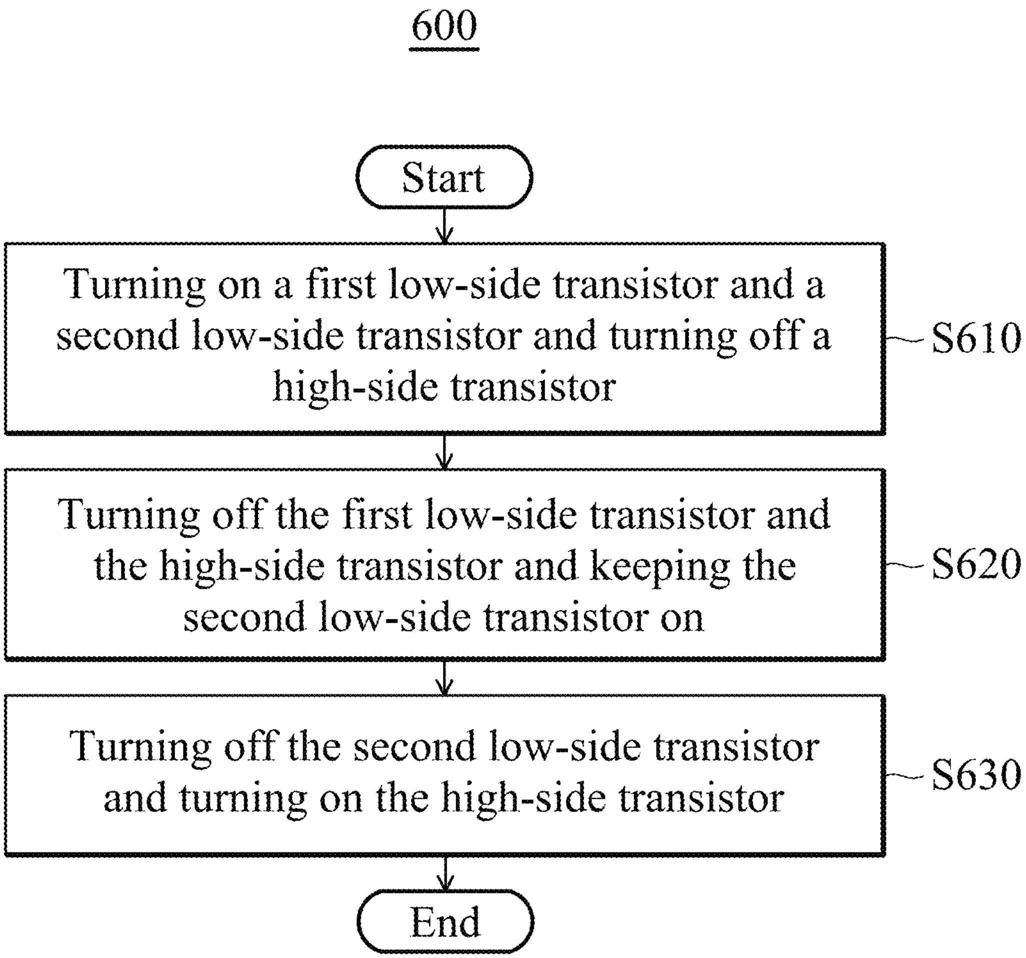
FIG. 6 is a flow chart of a driving method in accordance with an embodiment of the present invention.

FIG. 6 is a flow chart of a driving method in accordance with an embodiment of the present invention. The following description of the flow chart 600 will be combined with the driving circuit 200 of FIG. 2 and the waveform diagram 300 of FIG. 3 for detailed description. According to some embodiments of the present invention, the high-side transistor QH, the first low-side transistor QL1, and the second low-side transistor QL2 of FIG. 2 form a half-bridge driving circuit, so the driving method 600 can also be regarded as a driving method for driving a half-bridge driving circuit including the high-side transistor QH, the first low-side transistor QL1, and the second low-side transistor QL2.

First, in the first driving period, the first low-side transistor QL1 and the second low-side transistor QL2 of the half-bridge driving circuit are turned on and the high-side transistor QH of the half-bridge driving circuit is turned off (Step S610). In the embodiment of FIG. 3, the first driving period is the period between the initial time point T0 and the first time point T1. In the dead time after the first driving period, the first low-side transistor QL1 and the high-side transistor QH are turned off, and the second low-side transistor QL is kept on at the same time (Step S620), to eliminate the reverse recovery charge that has accumulated at the drain terminals of the first low-side transistor QL1 and the second low-side transistor QL2. In the embodiment of FIG. 3, the dead time is the period between the first time point T1 and the second time point T2.

In the second driving period after the dead time, the second low-side transistor QL2 is turned off and the high-side transistor QH is turned on (Step S630). In the embodiment of FIG. 3, the second driving period is after the third time point T3. According to some embodiments of the present invention, as shown in FIG. 2, the second low-side transistor QL2 is turned off based on the voltage of the switch node SW rising, so that the high-side transistor QH and the second low-side transistor QL2 are temporarily turned on at the same time during the period between the second time point T2 and the third time point T3 in FIG. 3. After the third time point T3, only the high-side transistor QH is turned on while the first low-side transistor QL1 and the second low-side transistor QL2 are turned off.

In the embodiments of FIG. 2 and FIG. 3, the high-side transistor QH is turned on at the second time point T2, so that the voltage of the switch node SW rises. The rising voltage of the switch node SW turns off the second low-side transistor QL2 at the third time point T3, and enters the second driving period. According to some embodiments of the present invention, the size or on-resistance of the second low-side transistor QL2 can be adjusted so that the reverse recovery charge can be completely eliminated during the period from the first time point T1 to the second time point T2, and the power loss caused by the high-side transistor QH and the second low-side transistor QL2 being turned on at the same time during the period from the second time point T2 to the third time point T3 can be controlled, so as to obtain the best power conversion efficiency.

The present invention proposes a driving circuit and a driving method capable of eliminating the reverse recovery charge of the low-side transistor. By dividing the low-side transistor into a first low-side transistor and a second low-side transistor and delaying the shutdown of the second low-side transistor having a smaller size, it is helpful to eliminate the reverse recovery charge accumulated at the drain terminal of the low-side transistor, thereby improving the power conversion efficiency.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A driving circuit, comprising:
- a high-side transistor, coupled between an input voltage and a switch node;
- a first low-side transistor, coupled between the switch node and a ground;
- a second low-side transistor, coupled between the switch node and the ground; and
- a control circuit, periodically and individually turning on the high-side transistor and the first low-side transistor;
- wherein after the first low-side transistor is turned off, the control circuit keeps the second low-side transistor on until the high-side transistor is turned on, so as to eliminate reverse recovery charge of the first low-side transistor.

2. The driving circuit as claimed in claim 1, wherein when the high-side transistor is turned on, the control circuit turns off the second low-side transistor based on a voltage of the switch node.

3. The driving circuit as claimed in claim 1, wherein after the first low-side transistor is turned off and a delay time has been elapsed, the control circuit turns off the second low-side transistor.

4. The driving circuit as claimed in claim 3, wherein the delay time is determined by a resistor and a parasitic capacitor of a gate terminal of the second low-side transistor.

5. The driving circuit as claimed in claim 1, wherein a size of the second low-side transistor is less than a size of the first low-side transistor.

6. The driving circuit as claimed in claim 1, wherein on-resistance of the second low-side transistor exceeds on-resistance of the first low-side transistor.

7. The driving circuit as claimed in claim 1, wherein the control circuit further comprises:
- a discharge control circuit, comprising:
  - a clamp transistor, providing a voltage of the switch node to a control node based on a clamp voltage to generate a control signal; and
  - a control transistor, coupling a gate terminal of the second low-side transistor to the ground based on the control signal.

8. The driving circuit as claimed in claim 7, wherein the clamp transistor is configured to limit a voltage level of the control signal to not exceed the clamp voltage minus a threshold voltage of the clamp transistor, preventing the control signal from getting too high and burning out the control transistor;
- wherein when the high-side transistor is turned on, the clamp transistor enables the control signal based on the voltage of the switch node;
- wherein the control signal being enabled turns on the control transistor, causing the control transistor to couple the gate terminal of the second low-side transistor to the ground, so as to turn off the second low-side transistor.

9. The driving circuit as claimed in claim 7, wherein the discharge control circuit further comprises:
- a delay capacitor, coupled between the gate terminal of the second low-side transistor and the ground;
- a discharge resistor, coupled between the gate terminal of the second low-side transistor and the ground; and
- a delay resistor, coupled between a gate terminal of the first low-side transistor and the gate terminal of the second low-side transistor.

10. The driving circuit as claimed in claim 9, wherein a delay time from the first low-side transistor being turned off to the second low-side transistor being turned off is determined by a product of the delay resistor and a sum of the delay capacitor and a parasitic capacitor of the gate terminal of the second low-side transistor;
- wherein when the control transistor is turned off, the discharge resistor is configured to couple the gate terminal of the second low-side transistor to the ground and to discharge the delay capacitor.

11. The driving circuit as claimed in claim 1, wherein the high-side transistor, the first low-side transistor, and the second low-side transistor form a half-bridge driving circuit.

12. A driving method for driving a half-bridge driving circuit, wherein the driving method comprises:
- turning on a first low-side transistor and a second low-side transistor of the half-bridge driving circuit and turning off a high-side transistor of the half-bridge driving circuit in a first driving period;
- turning off the first low-side transistor and the high-side transistor and keeping the second low-side transistor on during a dead time after the first driving period, so as to eliminate reverse recovery charge of the first low-side transistor; and
- turning off the second low-side transistor and turning on the high-side transistor in a second driving period after the dead time.

13. The driving method as claimed in claim 12, wherein the high-side transistor is coupled between an input voltage and a switch node, and the first low-side transistor and the second low-side transistor are coupled between the switch node and a ground;
- wherein the step of turning off the second low-side transistor and turning on the high-side transistor further comprises:
  - turning off the second low-side transistor in response to a voltage of the switch node rising to a threshold voltage.

14. The driving method as claimed in claim 13, wherein the step of turning off the second low-side transistor and turning on the high-side transistor further comprises:
- receiving the voltage of the switch node by a drain terminal of a clamp transistor to generate a control signal;
- receiving a clamp voltage by a gate terminal of the clamp transistor to limit the voltage level of the control signal; and
- turning off the second low-side transistor based on the control signal;
- wherein when the control signal is enabled, the second low-side transistor is turned off.

15. The driving method as claimed in claim 14, wherein the step of turning off the second low-side transistor and turning on the high-side transistor further comprises:
- providing the control signal to a gate terminal of a control transistor;
- when the control signal is enabled, using the control transistor to couple a gate terminal of the second low-side transistor to the ground to turn off the second low-side transistor; and
- when the control signal is disabled, turning off the control transistor.

16. The driving method as claimed in claim 12, wherein after the high-side transistor is turned on, the second low-side transistor is turned off.

17. The driving method as claimed in claim 12, wherein there is a delay time between the first low-side transistor being turned off and the second low-side transistor being turned off;

wherein the delay time is determined by a delay resistor and a parasitic capacitor of a gate terminal of the second low-side transistor.

18. The driving method as claimed in claim 17, wherein a delay capacitor is coupled between the gate terminal of the second low-side transistor and a ground;

wherein the delay time is determined by a product of the delay resistor and a sum of the delay capacitor and the parasitic capacitor of the gate terminal of the second low-side transistor.

19. The driving method as claimed in claim 12, wherein the first low-side transistor and the second low-side transistor form a transistor array;

wherein the second low-side transistor is related to the first low-side transistor.

20. The driving method as claimed in claim 12, wherein on-resistance of the first low-side transistor is less than on-resistance of the second low-side transistor.

* * * * *